United States Patent
Tahata

(10) Patent No.: US 8,225,240 B2
(45) Date of Patent: Jul. 17, 2012

(54) SEMICONDUCTOR DEVICE

(75) Inventor: Takashi Tahata, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 552 days.

(21) Appl. No.: 12/382,675

(22) Filed: Mar. 20, 2009

(65) Prior Publication Data

US 2009/0259902 A1 Oct. 15, 2009

(30) Foreign Application Priority Data

Apr. 10, 2008 (JP) .................. 2008-102114

(51) Int. Cl.
*G06F 17/50* (2006.01)
*H01L 27/118* (2006.01)
*H01L 23/58* (2006.01)
*H01L 29/40* (2006.01)

(52) U.S. Cl. ............ 716/54; 716/51; 716/52; 716/53; 716/55; 716/56; 257/202; 257/637; 257/758; 257/773; 257/774

(58) Field of Classification Search .......... 716/50–56; 438/691, 692; 257/506, 637, 781
See application file for complete search history.

(56) References Cited

U.S. PATENT DOCUMENTS

| | | | | |
|---|---|---|---|---|
| 6,103,626 A * | 8/2000 | Kim | | 438/691 |
| 6,194,252 B1 * | 2/2001 | Yamaguchi | | 438/129 |
| 6,197,452 B1 * | 3/2001 | Matumoto | | 430/5 |
| 6,660,462 B1 * | 12/2003 | Fukuda | | 430/394 |
| 6,781,216 B2 * | 8/2004 | Nakamura | | 257/637 |
| 6,784,548 B2 * | 8/2004 | Kouno et al. | | 257/758 |
| 6,901,577 B2 * | 5/2005 | Kotani et al. | | 257/390 |
| 7,002,256 B1 * | 2/2006 | Nakamura | | 257/781 |
| 7,469,396 B2 * | 12/2008 | Hayashi et al. | | 716/119 |
| 7,638,851 B2 * | 12/2009 | Hong et al. | | 257/390 |
| 7,719,078 B2 * | 5/2010 | Tomita | | 257/506 |
| 7,820,344 B2 * | 10/2010 | Moon | | 430/5 |
| 7,849,432 B2 * | 12/2010 | Doong et al. | | 716/55 |
| 8,072,078 B2 * | 12/2011 | Kobayashi | | 257/773 |
| 2005/0009312 A1 * | 1/2005 | Butt et al. | | 438/587 |
| 2006/0084261 A1 * | 4/2006 | Iwaki | | 438/618 |
| 2006/0180865 A1 * | 8/2006 | Kogami et al. | | 257/355 |
| 2007/0063223 A1 * | 3/2007 | Choi | | 257/202 |
| 2009/0049420 A1 * | 2/2009 | Kobayashi | | 716/19 |

(Continued)

FOREIGN PATENT DOCUMENTS

CN 1211813 A 3/1999

(Continued)

*Primary Examiner* — Helen Rossoshek
(74) *Attorney, Agent, or Firm* — McGinn IP Law Group, PLLC

(57) ABSTRACT

Provided is a semiconductor device that can be reduced in size while variation in shape among circuit patterns is reduced. The semiconductor device includes multiple circuit patterns and first dummy patterns. The multiple circuit patterns are disposed at regular intervals, and are used as part of the circuit. The multiple circuit patterns consist of two outermost circuit patterns and the other inner circuit patterns. The first dummy patterns are disposed on outer sides of the two outermost circuit patterns, respectively. The distance between each of the outermost circuit patterns and the corresponding first dummy pattern is equal to a distance between any adjacent two of the circuit patterns. A width of each of the first dummy patterns is smaller than a width of any of the circuit patterns, and is equal to a minimum design rule width, for example.

11 Claims, 4 Drawing Sheets

U.S. PATENT DOCUMENTS

| | | | |
|---|---|---|---|
| 2009/0121349 A1* | 5/2009 | Suzuki | 257/737 |
| 2009/0206490 A1* | 8/2009 | Koide et al. | 257/774 |
| 2010/0115479 A1* | 5/2010 | Hatano et al. | 716/4 |
| 2010/0293515 A1* | 11/2010 | Inoue et al. | 716/14 |
| 2010/0306727 A1* | 12/2010 | Itagaki | 716/10 |
| 2011/0006424 A1* | 1/2011 | Ito et al. | 257/741 |
| 2011/0124194 A1* | 5/2011 | Kwon et al. | 438/692 |
| 2011/0248387 A1* | 10/2011 | Kamon | 257/620 |

FOREIGN PATENT DOCUMENTS

| | | |
|---|---|---|
| JP | 57-128949 | 8/1982 |
| JP | 62-21260 | 1/1987 |
| JP | 2-69972 | 3/1990 |
| JP | 7-030065 | 1/1995 |
| JP | 8-223042 | 8/1996 |

* cited by examiner

SEMICONDUCTOR DEVICE

BACKGROUND OF THE INVENTION

1. Field of the Invention

The present invention relates to a semiconductor device including a dummy pattern.

2. Description of the Related Art

Some semiconductor devices have circuit patterns of components, such as gate electrodes of transistors, wiring resistances or diffusion resistances, that are disposed at regular intervals. In formation of such circuit patterns, the outermost pattern may result in having a different shape from those of the inner patterns. This attributes to the following reason.

The outermost pattern has no pattern provided outside itself, while the other patterns each have another pattern both outside and inside itself. In the case of patterns formed by etching, for example, neighboring patterns affect determination of the shape of each pattern. For this reason, influence of neighboring patterns on the outermost pattern is different from that on the other patterns, which makes the shape of the outermost pattern different from the inner patterns. Thus, the circuit patterns end up with variation in shape. It is commonly known that such variation σ can be expressed by the following expression (1):

$$\sigma \propto 1/\sqrt{(w \times t)} \quad (1),$$

where w denotes the width of the circuit pattern, and t denotes the height of the circuit pattern, as described in Marcel J. M. Pelgrom et al.: Matching Properties of MOS Transistors, in *IEEE Journal of Solid-State Circuits*, vol. 24, No. 5, October 1989, pp. 1433-1440, M. Pelgrom et al.: Matching Properties of MOS Transistors, in *Nuclear Instruments and Methods in Physics Research*, Section A—Accelerators, Spectrometers, Detectors and Associated Equipment, pp. 624-626, August 1991, Tuinhout, H. P., Montree, A. H., Schmitz, J., Stolk P. A.: Effects of Gate Depletion and Boron Penetration on Matching of Deep Submicron CMOS Transistors, in *Electron Devices Meeting 1997, Technical Digest., International*, Dec. 7-10, 1997, pp. 631-634, Digital Object Identifier 10.1109/IEDM. 1997.650463, and Pelgrom, M. J. M., Tuinhout, H. P., Vertregt, M.: Transistor Matching in Analog CMOS Applications, in *Electron Devices Meeting 1998, IEDM '98 Technical Digest., International*, Dec. 6-9, 1998, pp. 915-918, Digital Object Identifier 10.1109/IEDM. 1998.746503.

An effective way to reduce the variation is to provide a dummy pattern outside the outermost pattern (see, for example, Japanese Patent Application Publications Nos. Hei 7-30065, Hei 2-69972, Hei 8-223042, Sho 57-128949 and Sho 62-21260).

Along with the recent advancement in miniaturization of semiconductor devices, the size of a dummy pattern for such a semiconductor device is also required to be a minimum. On the other hand, it has been considered that the width of the dummy pattern needs to be equal to that of the circuit pattern by taking account of the above expression (1). In view of these requirements, it has been concluded that the miniaturization of dummy patterns is finite.

SUMMARY OF THE INVENTION

An aspect of the present invention provides a semiconductor device including:

a plurality of circuit patterns formed at regular intervals, and used as part of a circuit; and a first dummy pattern formed outside one of the circuit patterns that is positioned outermost, wherein a distance between the outermost circuit pattern and the first dummy pattern is equal to a distance between any adjacent two of the circuit patterns, and the width of the first dummy pattern is smaller than the width of any of the circuit patterns.

According to the present invention, the width of the first dummy pattern is smaller than that of any of the circuit patterns. In addition, the distance between the side surface of the outermost pattern and the side surface of the dummy pattern is set equal to the distance between the facing side surfaces of each two adjacent circuit patterns. With this configuration, a reduction in size of the semiconductor device can be achieved while variation in shape among the circuit patterns is reduced.

DETAILED DESCRIPTION OF THE PREFERRED EMBODIMENTS

Figure 1:
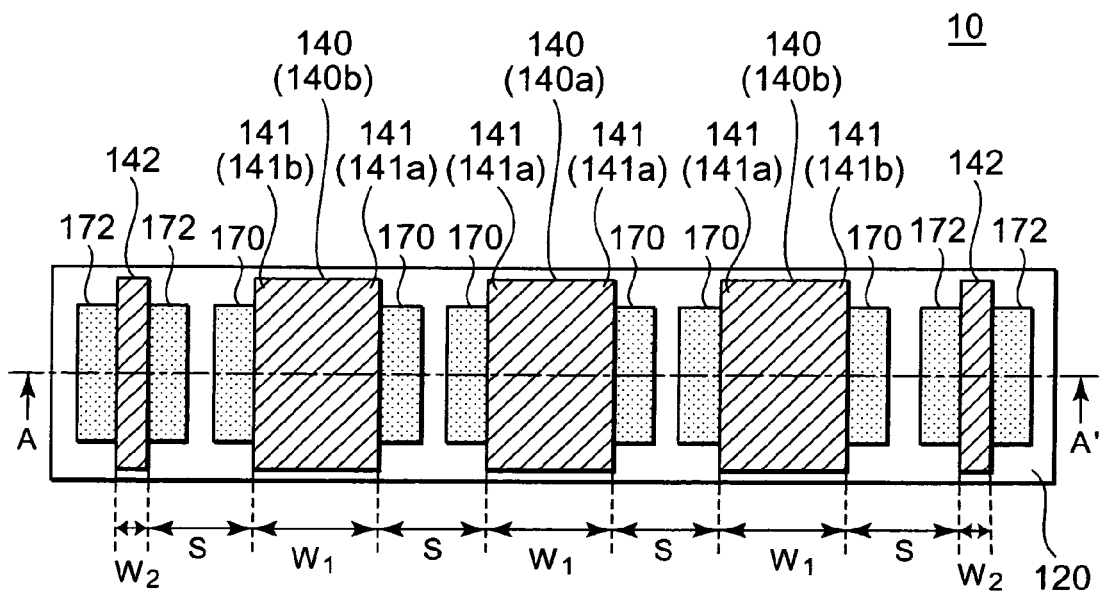
FIG. 1 is a plan view showing a main part of a semiconductor device according to a first embodiment.

Embodiments of the present invention are described below with reference to the accompanying drawings. The same components are denoted by the same reference numerals throughout the drawings, and explanations of the components are omitted as appropriate. In the following description, a dummy pattern means a pattern that is not used as part of a circuit, i.e., a pattern supplied with a floating potential, a fixed potential, or a signal that does not affect operations of the circuit.

Figure 2:
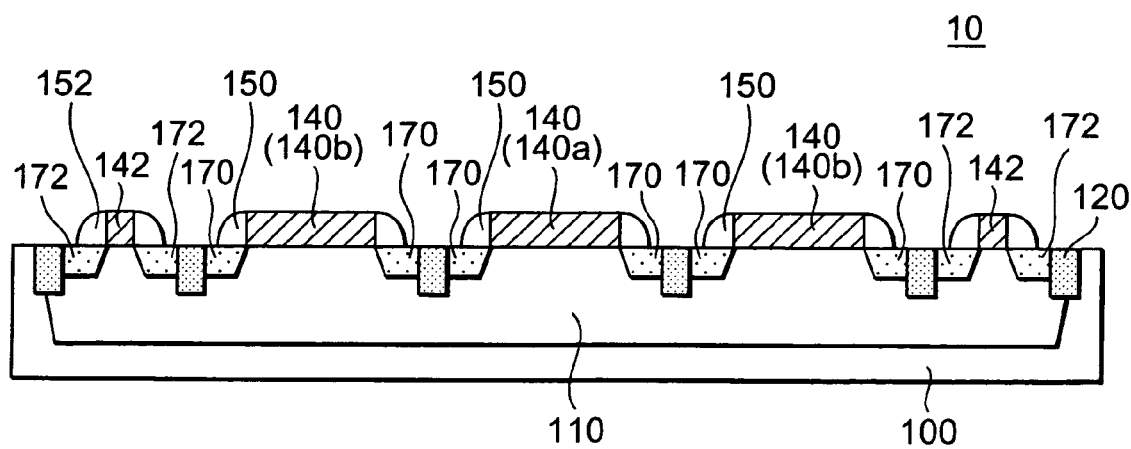
FIG. 2 is a cross-sectional view taken along a line A-A' in FIG. 1.

FIG. 1 is a plan view showing a main part of a semiconductor device 10 according to a first embodiment, and FIG. 2 is a cross-sectional view taken along a line A-A' in FIG. 1. The semiconductor device 10 includes multiple circuit patterns 140 and first dummy patterns 142. The multiple circuit patterns 140 are disposed at regular intervals, and are used as part of the circuit. The multiple circuit patterns 140 consist of: two circuit patterns 140b disposed respectively in outermost positions (referred to as outer most circuit patterns 140b below); and a different circuit pattern 140a (referred to as an inner circuit pattern 140a below). The first dummy patterns 142 are disposed on outer sides of the two outermost circuit patterns 140b, respectively. The distance between each of the outermost circuit patterns 140b and the corresponding first dummy pattern 142 is equal to a distance S between each two adjacent circuit patterns 140. A width $W_2$ of each of the first dummy patterns 142 is smaller than a width $W_1$ of any of the circuit patterns 140, and corresponds to a minimum design rule width, for example. In other words, the width $W_2$ of the first dummy pattern 142 is the smallest among those of elements and interconnections included in the semiconductor device 10.

Keen examination by the inventors brought the following findings. In order to reduce variation in shape among the circuit patterns 140, it is important to set the distance between facing side surfaces of the circuit pattern 140b and the dummy pattern 142 that are adjacent to each other, to be equal to that between facing side surfaces of any two adjacent circuit patterns 140. On the other hand, it is not effective for reduction of the variation to set the width of the dummy pattern 142 to be equal to that of any of the circuit patterns 140. This means that, even when the width $W_2$ of the first dummy pattern 142 is smaller than the width $W_1$ of any of the circuit patterns 140, reduction of difference in shape between each of the outermost circuit patterns 140b and the inner circuit pattern 140a is possible. Hence, the semiconductor device 10 can be reduced in size. Here, the maximum size reduction is achieved when the width $W_2$ of the first dummy patterns 142 is equal to the minimum design rule width.

In the example shown in FIGS. 1 and 2, the multiple circuit patterns 140 have the same shape, and are disposed so that their end parts on either side are aligned with each other in an extending direction of the multiple circuit patterns 140. The first dummy patterns 142 have the same length as that of the circuit patterns 140, and are disposed so that their end parts on either side are aligned with those of the multiple circuit patterns 140 in an extending direction of the first dummy patterns 142. With this configuration, a difference between the width of the circuit patterns 140b and the width of the circuit pattern 140a can be reduced. In addition, among corner parts 141 of the multiple circuit patterns 140, a difference between the shape of each outer corner part 141b of each of the circuit patterns 140b and the shape of each inner corner part 141a of the circuit pattern 140b can be reduced.

In the example shown in FIGS. 1 and 2, the circuit patterns 140 are gate electrodes of either transistors or MOS capacitor elements, and gate insulating films (not illustrated) are provided below the circuit patterns 140, respectively. The circuit patterns 140 and the dummy patterns 142 have the same height since they are formed in the same process. The transistors or the MOS capacitor elements are formed in an element formation region in the semiconductor layer 100. The semiconductor layer 100 may be a semiconductor substrate or a semiconductor layer of a semiconductor-on-insulator (SOI) substrate.

The element formation region is sectioned by an element isolation film 120. The element isolation film 120 is formed by means of a shallow-trench-isolation (STI) method or a local-oxidation-of-silicon (LOCOS) method. On side surfaces of the circuit patterns 140 serving as gate electrodes, side walls 150 are formed, respectively, while, on side surfaces of the first dummy patterns 142, side walls 152 are formed, respectively. The side walls 150 and 152 are omitted in FIG. 1. In a portion of the semiconductor layer 100 corresponding to the element formation region, a well 110 is formed. In the example shown in FIGS. 1 and 2, multiple element formation regions and transistors, and the two first dummy patterns 142 are formed in the single well 110.

In the well 110, multiple diffusion layers 170 serving as sources and drains of the multiple transistors or MOS capacitor elements, and dummy diffusion layers 172 to be positioned respectively on sides of the dummy patterns 142 are formed. The diffusion layers 170 and the dummy diffusion layers 172 have the same shape. The diffusion layers 170 and the dummy diffusion layers 172 are formed in self-alignment; specifically, they are formed by using the circuit patterns 140, the first dummy patterns 142, the side walls 150 and 152, and the element isolation film 120, as masks. Parts of the diffusion layers 170 and the dummy diffusion layers 172 are positioned under the side walls 150 and 152, respectively. The diffusion layers 170 and the dummy diffusion layers 172 each have a low concentration diffusion layer (not illustrated) in some cases. In such a case, the low concentration diffusion layers are formed in self-alignment; specifically, they are formed by using the circuit patterns 140 and the element isolation film 120 as masks.

When the diffusion layers 170 (each of which may include a low concentration impurity diffusion layer) are formed in self-alignment, parts of the diffusion layers 170 can be disposed respectively under the side walls 150, at least, which enables a reduction in size of the semiconductor device 10. However, variation in shape among the circuit patterns 140 serving as gate electrodes directly leads to variation in channel length, which results in another cause of variation in properties of the transistors or the MOS capacitor elements. To address this problem, in the first embodiment, the first dummy patterns 142 having a width smaller than that of each of the circuit patterns 140b are disposed on the outer sides of the two outermost circuit patterns 140b, respectively. Consequently, it is possible to reduce variation in shape among the circuit patterns 140, and to thereby reduce variation in properties of the transistors or the MOS capacitor elements, without preventing miniaturization of the semiconductor device 10.

Figure 3:
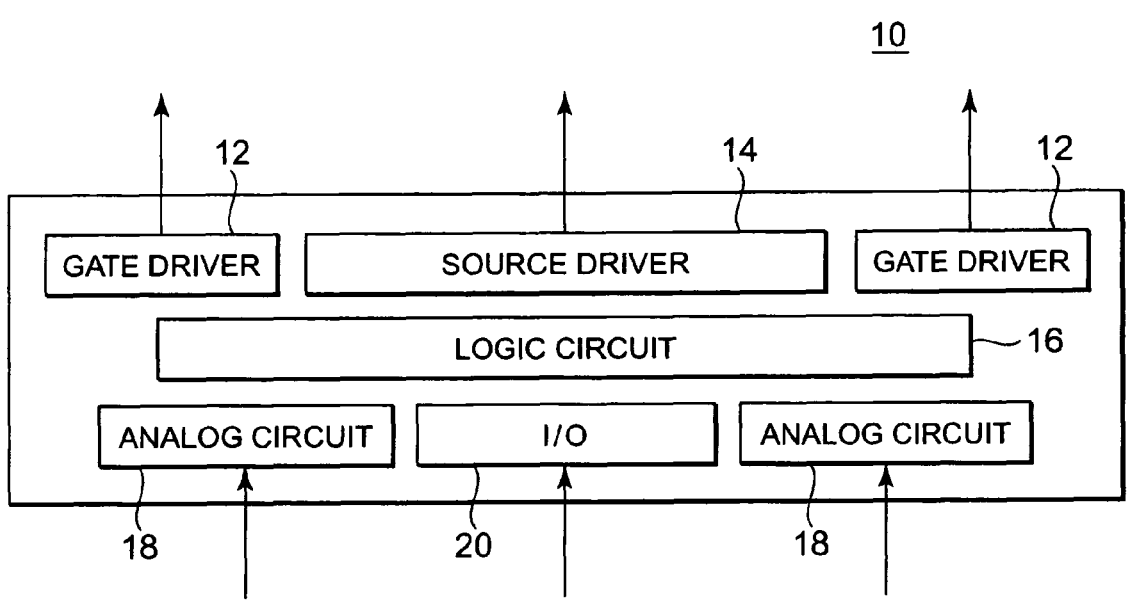
FIG. 3 is an example of a plan view of the semiconductor device.

FIG. 3 is an example of a plan view of the semiconductor device 10. The semiconductor device 10 shown in FIG. 3 is a driver chip for a flat display (such as a liquid crystal display or an organic light emitting display), and is rectangular in plan. The semiconductor device 10 includes gate driver regions 12, a source driver region 14, a logic region 16, analog regions 18 and an input/output (I/O) region 20. In each of the gate driver regions 12, a gate driver is provided. In the source driver region 14, a source driver is provided. In the logic region 16, a logic circuit is provided. In each of the analog regions 18, an analog circuit (a power supply circuit, for example) is provided. In the I/O region 20, an I/O circuit is provided.

The gate driver regions 12 and the source driver region 14 are arranged along one long side of the semiconductor device 10, while the analog regions 18 and the I/O region 20 are arranged along the other long side of the semiconductor device 10. The logic region 16 is arranged between the set of the source driver region 14 and the gate driver regions 12 and the set of the I/O region 20 and the analog regions 18.

The circuit patterns 140 and the dummy patterns 142 shown in FIGS. 1 and 2 are formed in the source driver region 14 or the analog regions 18, or both, for example. A wiring width $W_2$ of a gate electrode of a transistor formed in the logic region 16 is smaller than the width $W_1$ of the circuit patterns 140. The width $W_2$ of the dummy patterns 142, which is the minimum design rule width, is equal to or smaller than the wiring width $W_2$ of the gate electrode of the transistor formed in the logic region 16.

As described above, in the first embodiment, the width $W_2$ of the first dummy patterns 142 is smaller than the width $W_1$ of any of the circuit patterns 140. In addition, the distance between the facing side surfaces of the outermost circuit patterns 140b and the dummy pattern 142 that are adjacent to each other is set equal to that between the facing side surfaces of any two adjacent circuit patterns 140. With this configuration, a reduction in size of the semiconductor device 10 can be achieved while variation in shape among the circuit patterns 140 is reduced.

The first dummy patterns 142 each have the same length as that of each of the circuit patterns 140, and are disposed so that their end parts on either side are aligned with those of the multiple circuit patterns 140 in the extending direction of the first dummy patterns 142. With this configuration, among the corner parts 141 of the multiple circuit patterns 140, a difference between the shape of each outer corner part 141b of each of the circuit patterns 140b and the shape of each of other inner corner parts 141a can be reduced.

When the circuit patterns 140 are gate electrodes of transistors or MOS capacitor elements and the diffusion layers 170 are formed in self-alignment, variation in channel length can be reduced by reducing variation in shape among the circuit patterns 140. Consequently, variation in properties among the transistors or the MOS capacitor elements can be reduced.

Figure 4:
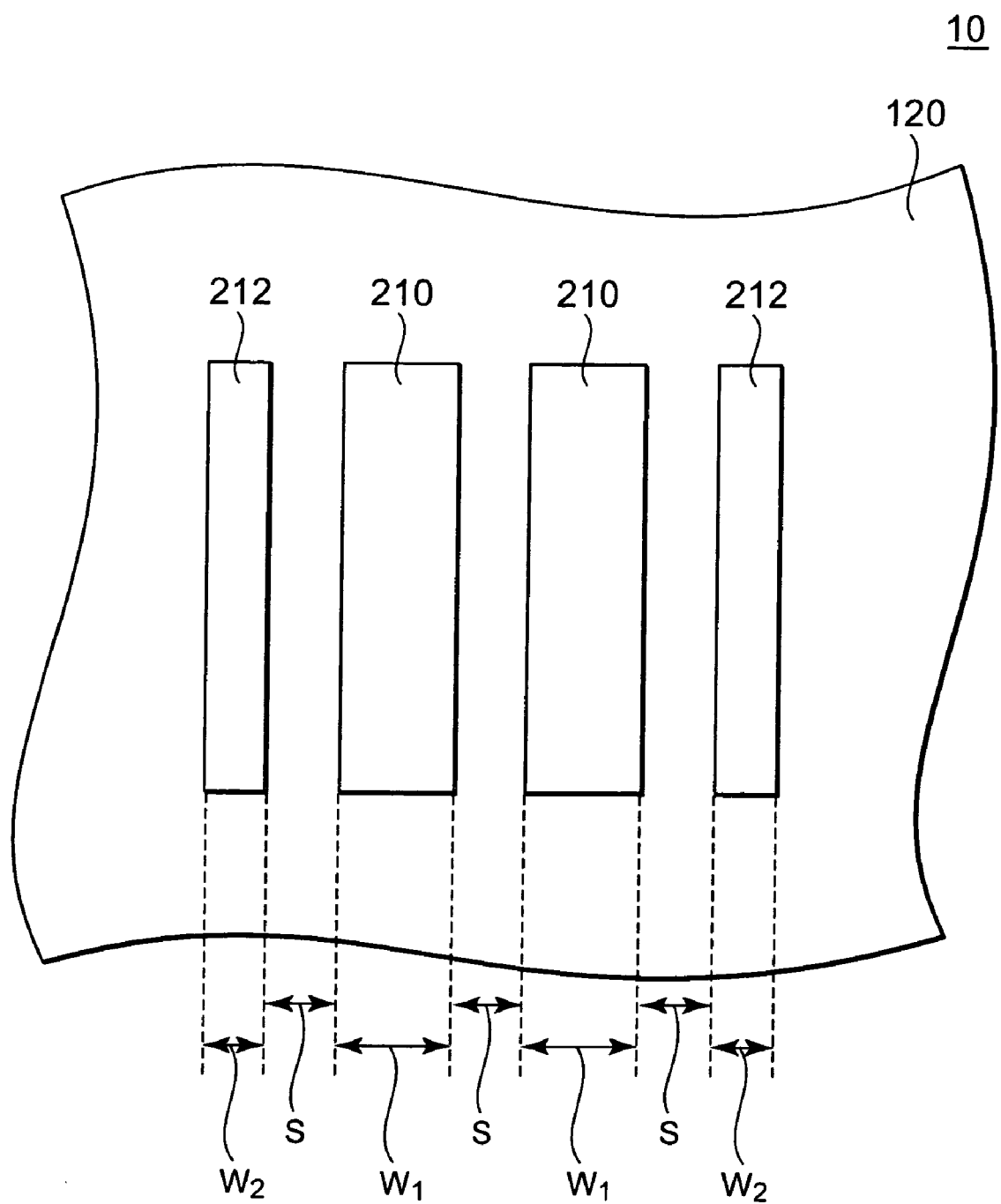
FIG. 4 is a plan view showing a main part of a semiconductor device according to a second embodiment.

FIG. 4 is a plan view showing a main part of the semiconductor device 10 according to a second embodiment. The semiconductor device 10 shown in FIG. 4 includes circuit patterns 210 serving as resistance elements, and first dummy patterns 212. The circuit patterns 210 are either wiring resistances or diffusion resistances. The circuit patterns 210 and the first dummy patterns 212 are formed in the source driver region 14 or the analog regions 18 shown in FIG. 3, or both, for example.

Since the relative shapes and arrangement of the circuit patterns 210 and the first dummy patterns 212 are the same as those of the circuit patterns 140 and the first dummy patterns 142 shown in FIGS. 1 and 2, descriptions of the shapes and arrangement are omitted here.

When the circuit patterns 210 are wiring resistances, the circuit patterns 210 and the first dummy patterns 212 are formed on the element isolation film 120. In this case, as in the first embodiment, variation in shape between the circuit patterns 210 can be reduced.

When the circuit patterns 210 are diffusion resistances, the circuit patterns 210 and the first dummy patterns 212 are formed respectively on parts of the semiconductor layer exposed from openings formed in the element isolation film 120. The openings are formed in the course of forming the element isolation film 120 by an STI method or a LOCOS method. For this reason, variation in shape between the circuit patterns 210, that is, variation in shape between the corresponding openings formed in the element isolation film 120, is mainly attributed to variation in shape between patterns of a hard mask used to form the element isolation film 120. In the second embodiment, the hard mask also includes dummy patterns corresponding to the first dummy patterns 212. Accordingly, it is possible to reduce variation in shape among the patterns included in the hard mask, and to thereby reduce variation in shape between the circuit patterns 210.

Also in the second embodiment, the width of the first dummy patterns 212 is set smaller than the width of each of the circuit patterns 210. With this configuration, a reduction in size of the semiconductor device 10 can be achieved while variation in shape between the circuit patterns 210 is reduced.

Figure 5:
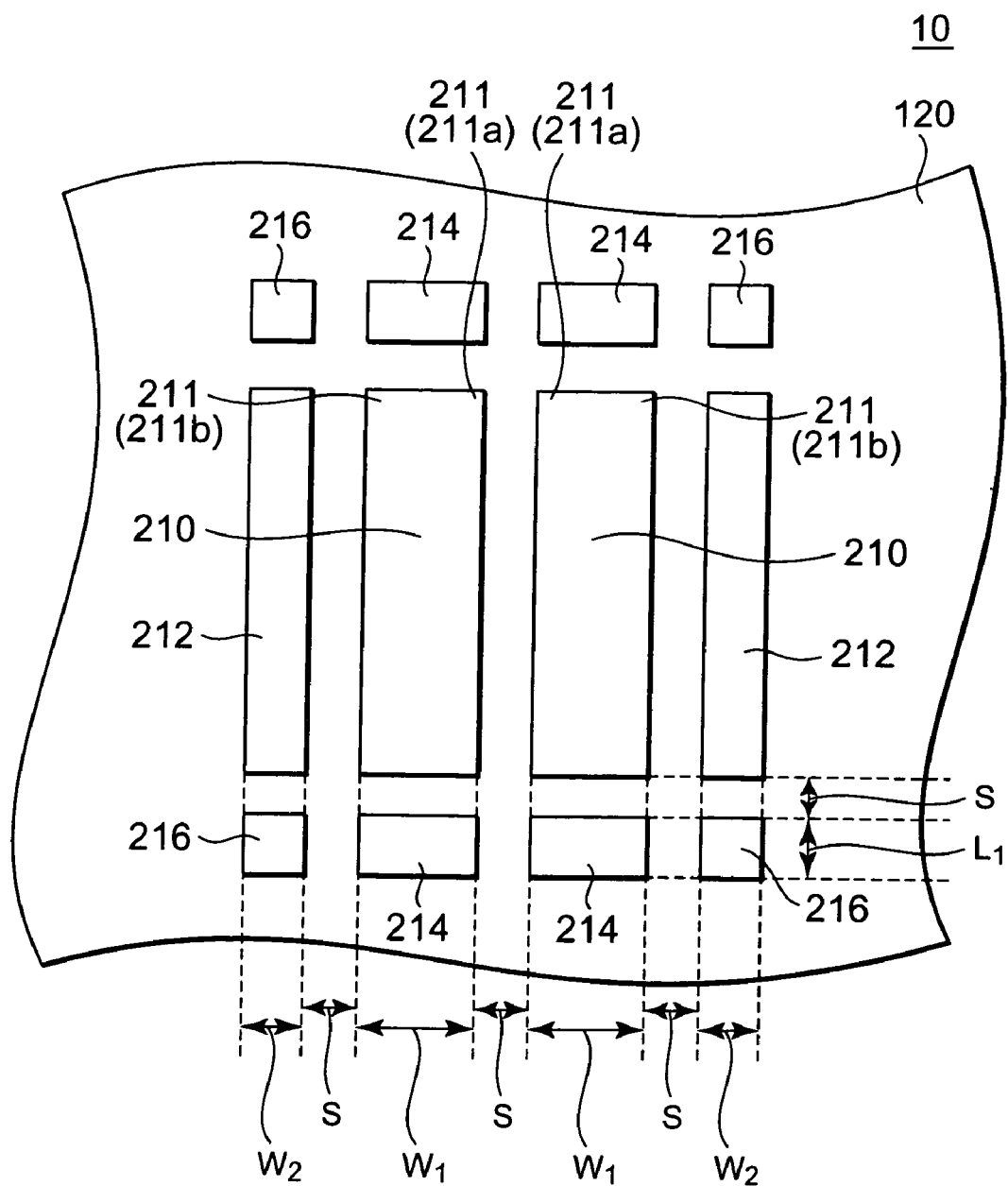
FIG. 5 is a plan view showing a main part of a semiconductor device according to a third embodiment.

FIG. 5 is a plan view showing a main part of the semiconductor device 10 according to a third embodiment. The semiconductor device 10 shown in FIG. 5 has the same structure as that according to the second embodiment except that semiconductor device 10 according to the third embodiment further includes second dummy patterns 214 and third dummy patterns 216. The second dummy patterns 214 and the third dummy patterns 216 are formed in the same process as the circuit patterns 210 and the first dummy patterns 212.

The second dummy patterns 214 are formed respectively outside both end parts of each of the circuit patterns 210. A distance between each of the circuit patterns 210 and the corresponding second dummy pattern 214 is S, which is equal to a distance between each of the circuit patterns 210 and the corresponding first dummy pattern 212. Accordingly, when the circuit patterns 210 are wiring resistances, excessive etching can be prevented at corner parts 211 of the multiple circuit patterns 210. When the circuit patterns 210 are diffusion resistances, excessive etching can be prevented at corner parts of patterns of a hard mask to be used to form the element isolation film 120, in the course of forming the patterns. Accordingly, deviation of the shapes of the end parts of the circuit patterns 210 from those originally designed is prevented. This effect is especially enhanced when the distance between each two adjacent second dummy patterns 214 is equal to the distance S between the circuit patterns 210 while the size of the second dummy patterns 214 in a width direction of the circuit patterns 210 is equal to the width $W_1$ of the circuit patterns 210.

In addition, a length $L_1$ of the second dummy patterns 214 in an extending direction of the circuit patterns 210 can be set smaller than the width $W_1$ of the circuit patterns 210. In this case, a reduction in size of the semiconductor device 10 can be achieved. The length $L_1$ of the second dummy patterns 214 is equal to the width $W_2$ of the first dummy patterns 212, which is the smallest width among those of elements and wires included in the semiconductor device 10, for example.

In the third embodiment, the third dummy patterns 216 are formed respectively outside both end parts of each of the two first dummy patterns 212. The width of the third dummy patterns 216 is equal to the width $W_2$ of the first dummy patterns 212, while the length of the third dummy patterns 216 is equal to the length $L_1$ of the second dummy patterns 214. The distance between each of the third dummy patterns 216 and the adjacent first dummy pattern 212 is equal to the distance between each of the circuit patterns 210 and the adjacent second dummy pattern 214, while the distance between the third dummy pattern 216 and the adjacent second dummy pattern 214 is equal to the distance between the circuit pattern 210 and the adjacent first dummy pattern 212. Thus, the condition for forming each outer corner part 211b positioned outermost among the corner parts 211 of each of the circuit patterns 210 can set to be the same as that for forming each inner corner part 211a. Accordingly, variation in shape among the corner parts 211 can be reduced.

As described above, according to the third embodiment, the same effects as those obtained according to the second embodiment can be obtained. In addition, since the second dummy patterns 214 are provided, deviation of the shapes of the end parts of the circuit patterns 210 from those originally designed is prevented. This effect is particularly enhanced when the length of the second dummy patterns 214 in the width direction of the circuit patterns 210 is equal to the width $W_1$ of the circuit patterns 210. Furthermore, since the third dummy patterns 216 are also provided, variation in shape among the corner parts 211 of the circuit patterns 210 can be reduced.

Although the embodiments of the present invention are described above with reference to the drawings, they are merely examples of the present invention; hence, various configurations other than those described above can be employed, instead. For example, the number of the circuit patterns 140 and the number of the circuit patterns 210 are not limited to those described in the embodiments, and may be larger than the described ones.

What is claimed is:
1. A semiconductor device, comprising:
a plurality of circuit patterns formed at regular intervals, and used as a part of a circuit;
a first dummy pattern formed outside one of the circuit patterns that is positioned outermost,
wherein a distance between an outermost circuit pattern and the first dummy pattern is equal to a distance between any adjacent two of the circuit patterns, and wherein a width of the first dummy pattern is less than a width of any of the circuit patterns, wherein each circuit pattern of the plurality of circuit patterns has a same shape, and is disposed so that end parts of the circuit patterns on either side are aligned with each other in an extending direction of the circuit patterns, and wherein the first dummy pattern has a same length as a length of the circuit pattern, and is disposed so that an end part of the first dummy pattern on either side is aligned with the end parts, on a same side, of the circuit patterns in an extending direction of the first dummy pattern; and second dummy patterns formed respectively outside both end parts of each of the plurality of circuit patterns, wherein a distance between each of the second dummy patterns and a corresponding one of the circuit patterns is equal to the distance between the outermost circuit pattern and the first dummy pattern, wherein a width of each of the second dummy patterns is equal to a width of the circuit patterns in a width direction of the circuit patterns, wherein a distance between any adjacent two of the second dummy patterns is equal to a distance between any adjacent two of the circuit patterns, and wherein a length of each of the second dummy patterns is less than the width of the circuit patterns in the extending direction of the circuit patterns.

2. The semiconductor device according to claim 1, further comprising:

an analog region in which an analog circuit is provided; and a logic region in which a logic circuit is provided, wherein the plurality of circuit patterns and the first dummy pattern are provided in the analog region.

3. The semiconductor device according to claim 2, wherein the logic circuit includes a logic circuit transistor, and wherein the width of the first dummy pattern is equal to or is less than a width of a gate wiring of the logic circuit transistor.

4. The semiconductor device according to claim 1, wherein each of the circuit patterns comprises one of a wiring resistance and a diffusion resistance.

5. The semiconductor device according to claim 1, wherein each circuit pattern of the circuit patterns comprises a gate electrode of one of a transistor and a MOS (metal-oxide-semiconductor) capacitor element.

6. The semiconductor device according to claim 5, further comprising:

a side wall formed on a side surface of the gate electrode; and diffusion layers serving as a source and a drain of one of the transistor and the MOS capacitor element, wherein a part of each of the diffusion layers is formed under the side wall.

7. The semiconductor device according to claim 1, wherein said second dummy patterns are formed respectively outside the end parts of each of the plurality of circuit patterns in a first direction of an extension of said each of the plurality of circuit patterns.

8. The semiconductor device according to claim 7, wherein the first dummy pattern is formed in a side of the outermost circuit pattern in a second direction, perpendicular to the first direction, of an extension of said each of the plurality of circuit patterns.

9. The semiconductor device according to claim 7, further comprising third dummy patterns formed respectively outside end parts of the first dummy pattern, wherein a distance between each of the third dummy patterns and the first dummy pattern is equal to a distance of each of the second dummy patterns and a corresponding one of the circuit patterns.

10. The semiconductor device according to claim 1, further comprising:

an analog region in which an analog circuit is provided, wherein the plurality of circuit patterns and the first dummy pattern are provided in the analog region.

11. A semiconductor device, comprising:

a plurality of circuit patterns formed at regular intervals, and used as a part of a circuit;

a first dummy pattern formed outside one of the circuit patterns that is positioned outermost, wherein a distance between an outermost circuit pattern and the first dummy, pattern is equal to a distance between any adjacent two of the circuit patterns, and wherein a width of the first dummy pattern is less than a width of any of the circuit patterns, wherein each circuit pattern of the plurality of circuit patterns has a same shape, and is disposed so that end parts of the circuit patterns on either side are aligned with each other in an extending direction of the circuit patterns, and wherein the first dummy pattern has a same length as a length of the circuit patterns, and is disposed so that an end part of the first dummy pattern on either side is aligned with the end parts, on a same side, of the circuit patterns in an extending direction of the first dummy pattern;

second dummy patterns formed respectively outside both end parts of each of the plurality of circuit patterns, wherein a distance between each of the second dummy patterns and a corresponding one of the circuit patterns is equal to the distance between the outermost circuit pattern and the first dummy pattern, wherein a width of each of the second dummy patterns is equal to a width of the circuit patterns in a width direction of the circuit patterns, and wherein a distance between any adjacent two of the second dummy patterns is equal to a distance between any adjacent two of the circuit patterns; and third dummy patterns formed respectively outside both end parts of the first dummy pattern, wherein the third dummy patterns have a same width as the width of the first dummy pattern, while having a same length as a length of the second dummy pattern, wherein a distance between each of the third dummy patterns and the first dummy pattern is equal to a distance of each of the second dummy patterns and a corresponding one of the circuit patterns, and wherein a distance between each of the third dummy patterns and one of the second dummy patterns that is adjacent to the third dummy pattern is equal to the distance between the outermost circuit pattern and the first dummy pattern.

* * * * *